US010506314B2

(12) United States Patent
Hartleb et al.

(10) Patent No.: US 10,506,314 B2
(45) Date of Patent: Dec. 10, 2019

(54) HOUSING FOR RECEIVING AN ELECTRICALLY OPERATED APPARATUS

(71) Applicant: ECOM Instruments GmbH, Assamstadt (DE)

(72) Inventors: Joerg Hartleb, Assamstadt (DE); Dieter Hofmann, Lauda-Koenigshofen (DE); Axel Sailer, Weikersheim (DE)

(73) Assignee: Ecom Instruments GmbH (DE)

( * ) Notice: Subject to any disclaimer, the term of this patent is extended or adjusted under 35 U.S.C. 154(b) by 0 days.

(21) Appl. No.: 15/940,951

(22) Filed: Mar. 29, 2018

(65) Prior Publication Data

US 2018/0288507 A1 Oct. 4, 2018

(30) Foreign Application Priority Data

Mar. 30, 2017 (DE) ........................ 10 2017 205 424

(51) Int. Cl.
*H04R 1/02* (2006.01)
*H05K 5/02* (2006.01)
*H04R 1/08* (2006.01)

(52) U.S. Cl.
CPC ............... *H04R 1/02* (2013.01); *H04R 1/023* (2013.01); *H04R 1/086* (2013.01); *H05K 5/02* (2013.01)

(58) Field of Classification Search
CPC .......... H04R 1/02; H04R 1/023; H04R 1/086; H05K 5/02
See application file for complete search history.

(56) References Cited

U.S. PATENT DOCUMENTS

2007/0086273 A1* 4/2007 Polany .................. H04B 11/00 367/131
2008/0123259 A1* 5/2008 Moser .................. G01F 15/006 361/679.21
2009/0060246 A1 3/2009 Baliga et al.
2016/0228826 A1* 8/2016 Furuuchi .................. H05K 5/06
2018/0091881 A1* 3/2018 Evans ...................... H04R 1/08
2019/0025133 A1* 1/2019 Lee ...................... G06F 3/0412

FOREIGN PATENT DOCUMENTS

DE 102010049927 A1 8/2011

OTHER PUBLICATIONS

English abstract for DE-102010049927.

* cited by examiner

*Primary Examiner* — Regina N Holder
(74) *Attorney, Agent, or Firm* — Fishman Stewart PLLC

(57) ABSTRACT

A housing for receiving an electrically operated apparatus may include an inner housing part at least partially defining a housing interior. The inner housing part may include an inner passage opening. The housing may also include an outer housing part disposed on a side of the inner housing part facing away from the housing interior. The outer housing part may include an outer passage opening. The outer passage opening and the inner passage opening may at least partially define an acoustic duct for discharging airborne noise from the housing interior. The acoustic duct may be closed by a fluid-tight and airborne noise-permeable membrane. Further, the housing may include a porous member disposed within the acoustic duct configured to prevent an ignition breakthrough from the housing interior into an external environment outside of the outer housing part.

23 Claims, 1 Drawing Sheet

HOUSING FOR RECEIVING AN ELECTRICALLY OPERATED APPARATUS

CROSS-REFERENCE TO RELATED APPLICATIONS

This application claims priority to German Patent Application No. DE 10 2017 205 424.7, filed on Mar. 30, 2017, the contents of which are hereby incorporated by reference in its entirety.

TECHNICAL FIELD

The invention relates to a housing for receiving an electrically operated apparatus and to an assembly having such a housing.

BACKGROUND

In so-called regions exposed to the risk of explosions, for example on offshore drilling platforms, the electrical energy that bears on the outer electronic interfaces of an electrically operated apparatus can ignite a gas/air mixture or a dust/air mixture that is present in the region exposed to the risk of explosions and thus cause said gas/air mixture or dust/air mixture to explode. This to a particular degree applies to highly reactive gas mixtures such as, for instance, mixtures from hydrogen and oxygen, to which said electrical energy is available as an activation energy in order for an exothermal reaction of hydrogen and oxygen so as to form water to be initiated. This applies in a similar fashion to dust/air mixtures such as, for example, carbon dust/air mixtures.

Against this background, it is known from the prior art to provide pressure-resistant housings in which electrically operated apparatuses can be received when the latter are to be used in a region exposed to the risk of explosions.

It often proves disadvantageous in the case of such pressure-resistant housings that the latter are typically embodied so as to be tight in terms of airborne noise. An airborne noise that is generated by a loudspeaker of the electrically operated apparatus can thus not make its way from the housing interior to the outside. Conversely, in the case of a microphone for the detection of noise being disposed in the apparatus, said microphone can also not detect any noise from outside the pressure-resistant housing. In other words, the housing interior that is delimited by conventional pressure-resistant housings is typically acoustically insulated from the external environment of the housing.

SUMMARY

It is therefore an object of the present invention to create a housing for receiving an electrically operated apparatus and for use in a region that is exposed to the risk of explosions, in which housing the housing interior is acoustically coupled to the external environment of the housing.

This object is achieved according to the invention by the subject matter of the independent claim(s). Advantageous embodiments are the subject matter of the dependent claim (s).

The basic concept of the invention is thus to equip an acoustic duct for discharging noise from the housing interior to the external environment of the housing and vice versa in a pressure-resistant housing with a porous member which in the case of an explosion prevents an ignition breakthrough from the housing interior to the outside, and to additionally close the acoustic duct with an airborne noise-permeable membrane so as to protect the acoustic duct from contamination, for instance by dirt particles that are present in the external environment. In this way, the desired positive acoustic coupling of the housing interior to the external environment is implemented, on the one hand. It is however also ensured on the other hand that in the event of a hot gas being ignited in the housing interior, said gas cannot make its way to the outside into the external environment of the housing by means of an ignition breakthrough.

The housing according to the invention proposed herein thus permits the operation of both a loudspeaker as well as a microphone of an electrically operated apparatus that is received in the housing interior. A loudspeaker or microphone, respectively, of the electrically operated apparatus can thus also be used in a region exposed to the risk of explosions. In particular, it is not necessary for an electrical signal line to be provided for transmitting audio signals from the electrically operated apparatus to the outside, out of the housing.

A housing according to the invention for receiving an electrically operated apparatus, in particular for use in an explosion-proof region comprises at least one inner housing part which at least partially delimits a housing interior, and in which an inner passage opening is present. At least two inner housing parts that are fastened to one another and conjointly configure an inner housing can preferably be provided. The housing furthermore comprises at least one outer housing part which is disposed on a side of the inner housing part that faces away from the housing interior, i.e. outside the inner housing part and in which an outer passage opening is present. At least two outer housing parts that are fastened to one another and conjointly configure an outer housing can preferably be provided. The outer and the inner passage opening configure at least part of an acoustic duct for discharging airborne noise from the housing interior, to which end said outer and inner passage openings fluidically communicate with one another. The two passage openings are preferably disposed so as to be in mutual alignment. Airborne noise which is generated by an acoustic source, preferably a loudspeaker, provided on the electrically operated apparatus can in this way be transmitted from the housing interior to the outside, into the external environment of the housing. Conversely, airborne noise from the external environment of the housing can be directed into the housing interior by means of the acoustic duct, where said airborne noise can be detected by an acoustic sensor, preferably a microphone, provided on the electrically operated apparatus. The acoustic duct thus establishes an acoustic connection between the housing interior and the external environment of the housing, the housing exterior. According to the invention, the acoustic duct is closed by a fluid-tight and airborne noise-permeable membrane. The membrane serves for protecting the acoustic duct from any contamination from the outside. According to the invention, a porous member is moreover disposed in the acoustic duct. The porous member serves for preventing an ignition breakthrough from the housing interior to the outside, into the external environment of the housing.

The porous member is expediently configured so as to be permeable to airborne noise. A positive acoustic coupling of the housing interior to the external environment of the housing by way of the acoustic duct is ensured in this way.

In the case of one advantageous refinement, the outer passage opening is framed by a preferably round opening collar that projects outwards, away from the inner housing part. In the case of this embodiment, at least one cut-out for the passing of airborne noise is provided in the opening collar. Preferably, a plurality of cut-outs which are disposed at a mutual spacing, particularly preferably so as to be equidistant, are provided. In the case of this refinement, a cover which axially covers the outer passage opening is disposed on the opening collar. The acoustic duct can be protected particularly effectively from contamination and also from external mechanical impacts/shocks by means of such a cover. Airborne noise can nevertheless make its way from the external environment of the housing into the acoustic duct and also out of the latter by way of the at least one cut-out, preferably by way of the plurality of cut-outs.

The membrane is particularly expediently disposed so as to be spaced apart from the cover. Alternatively or additionally thereto, the membrane is disposed so as to be spaced apart from the porous member. Both measures, either individually or in combination, ensure that the membrane can freely oscillate and thus has a high permeability to airborne noise.

The spacing between the membrane and the porous member can expediently be at most 1 mm, preferably at most 0.25 mm. A very positive acoustic coupling between the membrane and the porous member can be ensured in this way.

The membrane particularly preferably by way of an outer periphery is fastened to the outer housing part, preferably on an internal side of the opening collar that faces the inner housing part. This measure ensures a reliable and stable mechanical fastening of the membrane to the outer housing. Since the region of the membrane that is complementary to the outer periphery is freely disposed in the outer passage opening, or in the acoustic duct, respectively, a high permeability to airborne noise and thus a positive acoustic coupling through the membrane is achieved.

In the case of one preferred embodiment, the porous member is at least partially disposed in the inner passage opening. In this way, any ignition breakthrough from the housing interior to the outside, into the external environment of the housing, can be prevented in a particularly effective manner.

A part of the acoustic duct is expediently disposed in the housing interior and by way of the inner and the outer passage opening is acoustically connected to the external environment of the housing.

According to one advantageous refinement, a separation element which acoustically separates that part of the housing interior that forms part of the acoustic duct from the part, complementary to the former, of the housing interior is disposed in the housing interior. This enables the noise to be transported with low damping through the housing interior. The separation element can be configured as a separation wall.

The separation element is particularly preferably attached to the inner and/or the outer housing part.

The porous member particularly preferably extends across an entire duct cross section of the inner passage opening. An undesirable ignition breakthrough through the acoustic duct to the outside is particularly effectively prevented in this way.

In the case of one advantageous refinement, the porous member engages through the entire inner passage opening and preferably protrudes from the inner housing part beyond the inner passage opening. A hot gas that has been ignited in the housing interior can be particularly effectively cooled in this way, prior to said gas being released from the acoustic duct into the external environment of the housing.

According to another preferred embodiment, the porous member comprises a main portion which is disposed in the inner passage opening. In the case of this embodiment, the main portion transitions inwards, towards the housing interior, into a fastening portion which protrudes the main portion in a radially outwards manner. The main portion in the inner passage opening and the fastening portion are particularly preferably disposed outside the inner passage opening. The porous member is fastened to an internal side of the inner housing part by means of the fastening portion. The main portion disposed in the inner passage opening serves for cooling a gas that has been ignited in the housing interior as said gas passes through the acoustic duct, or through the inner passage opening, respectively.

The fastening portion particularly expediently by means of an adhesive connection can be fastened to the inner housing part. In the case of one advantageous refinement, the inner housing part can be composed of glass or comprise glass. Alternatively or additionally, the outer housing part can be composed of a metal or of a plastics material, or can comprise a metal or a plastics material. Other materials that are suitable for the pressure-resistant encapsulation are also conceivable in variants.

The porous member in an axial longitudinal section expediently has a T-type geometry. Such a geometry permits a particularly stable fastening of the porous member to the inner housing part.

The material of the porous member is particularly preferably an open porous material. A particularly high air permeability and thus a positive acoustic coupling between the housing interior and the external environment of the housing is achieved in this manner without the prevention of the ignition breakthrough that is to be achieved by the porous member being reduced on account thereof.

In the case of one advantageous refinement, the material of the porous member is or comprises a sintered material, preferably a sintered metal or a sintered glass or a sintered plastics material. A sintered material has the desired porous or open porous properties, respectively, is easy to produce, and is thus also procurable in a cost-effective manner.

The membrane particularly preferably comprises a flexible material or is composed of a flexible material which is configured to be both fluid-tight as well as airborne noise-tight. To this end, a textile material is to be particularly considered. Such a flexible or textile material, respectively, permits a fluid-tight closure of the outer passage opening and thus of the acoustic duct, such that the porous member disposed within the membrane is protected from external contamination, on the one hand. On the other hand, however, the required positive acoustic coupling of the acoustic duct to the external environment of the housing is also guaranteed.

The inner and the outer housing part are expediently configured in at least two parts.

The inner and the outer housing part are particularly preferably produced from dissimilar materials.

The invention furthermore relates to an assembly having a housing according to the invention as has been introduced above. The assembly comprises an electrically operated apparatus that is disposed in the housing interior. The advantages explained above of the housing according to the invention thus also apply to the assembly according to the invention.

Further important features and advantages of the invention are derived from the dependent claims, from the drawings, and from the associated description of the figures by means of the drawings.

It is understood that the features mentioned above and yet to be explained hereunder can be used not only in the respective combination set forth but also in other combinations or individually, without departing from the scope of the present invention.

Preferred exemplary embodiments of the invention are illustrated in the drawings and will be explained in more detail in the following description, wherein the same reference signs relate to identical or similar or functionally equivalent components.

BRIEF DESCRIPTION OF THE DRAWINGS

In the drawings, in each case in a schematic manner.

DETAILED DESCRIPTION

Figure 1:
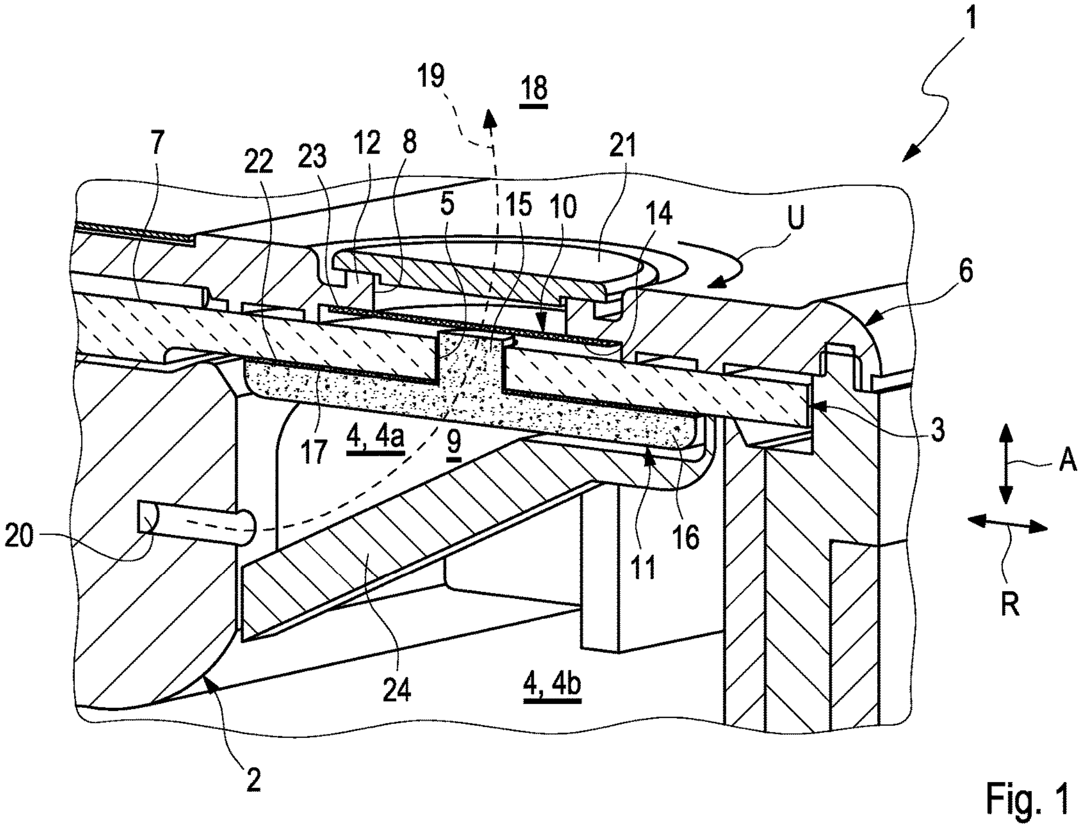
FIG. 1 shows an example of a housing according to the invention in a perspective sectional illustration.
Figure 2:
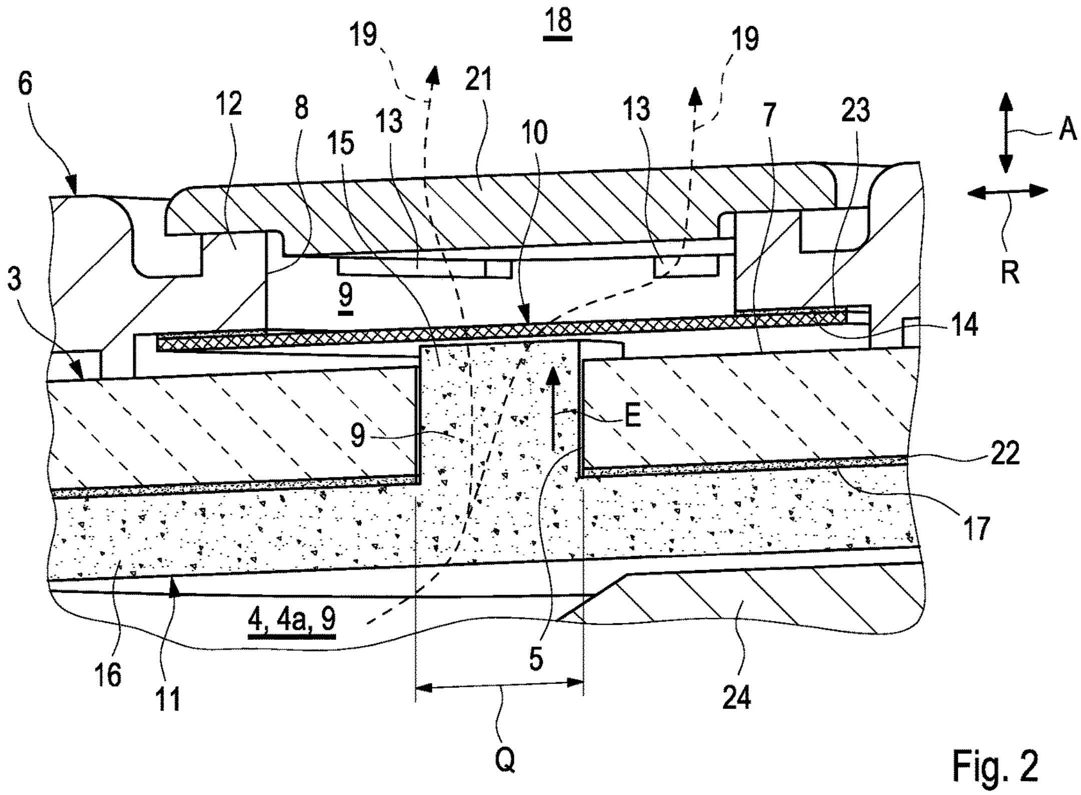
FIG. 2 shows a detailed illustration of FIG. 1.

FIG. 1 in a perspective sectional illustration shows an example of a housing 1 according to the invention for receiving an electrically operated apparatus 2. FIG. 2 is a detailed illustration of FIG. 1. The housing 1 is configured for use in an explosion-proof region and comprises an inner housing part 3 which partially delimits a housing interior 4. An inner passage opening 5 is configured in the inner housing part 3. The housing 1 moreover comprises an outer housing part 6 which is disposed on a side 7 of the inner housing part 3 that faces away from the housing interior 4. An outer passage opening 8 is configured in the outer housing part 6. The inner and the outer housing part 3, 6 are configured in two parts and from dissimilar materials. The outer passage opening 8 and the inner passage opening 5 are part of an acoustic duct 9 for discharging airborne noise from the housing interior 4. A part 4*a* of the acoustic duct 9 herein is disposed in the housing interior 4 and is acoustically connected to the external environment 18 of the housing 1 by way of the inner and the outer passage opening 5, 8. According to FIG. 1, a separation element 24 which acoustically separates that part 4*a* of the housing interior 4 that forms the part of the acoustic duct 9 from the part 4*b*, complementary to the former, of the housing interior 4 is disposed in the housing interior 4. As is shown in FIG. 1, the separation element 24 can be attached to the inner housing part 3 or, alternatively thereto, to the outer housing part 6 (not shown). The separation element 24 can be configured as a separation wall.

As can be seen from the illustration of FIG. 1, the acoustic duct 9 in the region of the outer passage opening 8 is closed by a fluid-tight and airborne noise-permeable membrane 10. Moreover, a porous member 11 which is configured so as to be permeable to airborne noise is disposed in the acoustic duct 9. If an explosion arises in the housing interior 4, the porous member 11 prevents an ignition breakthrough from the housing interior 4 to the outside, into the external environment 18 of the housing 1.

An acoustic source in the form of a loudspeaker 20 which generates airborne noise can be disposed on or in the electrically operated apparatus 2. This airborne noise exits from the loudspeaker 20 into the housing interior 4 and is directed from the housing interior 4 by way of the acoustic duct 9 to the outside into the external environment 18 of the housing 1. The acoustic wave profile from the loudspeaker 20 to the external environment 18 of the housing 1 in FIGS. 1 and 2 is indicated by arrows identified by the reference sign 19. Instead of the loudspeaker 20, a microphone (not shown) can also be used on the electrically operated apparatus 2 when a noise is to be directed from the external environment 18 by way of the housing interior 4 to the microphone of the electrically operated apparatus. Instead of a loudspeaker 20, an acoustic sensor in the form of a microphone (not shown) can also be disposed on or in the electrically operated apparatus 2, by means of which acoustic sensor any airborne noise that is present in the external environment 18 by means of the acoustic duct 9 and directed into the housing interior 4 is to be detected.

As can be seen in the detailed illustration of FIG. 2, the outer passage opening 8 is framed by an opening collar 12 that projects outwards, away from the inner housing part 3. A plurality of cut-outs 13 are configured in the opening collar 12 so as to be mutually spaced apart along the circumferential direction U of the latter, said cut-outs 13 preferably being disposed so as to be mutually equidistant along the circumferential direction U. A cover 21 for axially covering the outer passage opening 8 is moreover disposed on the opening collar 12. The membrane 10 is disposed so as to be spaced apart from said cover 21 such that the membrane 10 can freely oscillate in order to transmit airborne noise. For the same reason, the membrane 10 is also disposed so as to be spaced apart from the porous member 11.

The spacing between the membrane 10 and the porous member 11 is preferably chosen so as to be as small as possible so as to ensure a positive acoustic coupling between the membrane 10 and the porous member 11. In the exemplary scenario, this spacing is at most 1 mm, particularly preferably at most 0.25 mm.

As can be seen from the detailed illustration of FIG. 2, the membrane 10 by way of an outer periphery 23 is fastened to an internal side 14 of the opening collar 12 that faces the inner housing part 3. Both measures ensure a positive acoustic coupling for transmitting the airborne noise between the porous member 11 and the membrane 10.

In order for a high cooling effect to be ensured in a gas ignited in the course of an explosion in the housing interior 4 when said gas passes through the acoustic duct 9, the porous member 11 extends across an entire duct cross section Q of the inner passage opening 5.

The porous member 11 moreover engages through the entire inner passage opening 5, along the direction of extent E of the latter, which is defined by a dissemination direction of the airborne noise, and said porous member 11 can protrude from the inner housing part 3 beyond the inner passage opening 5, as is illustrated in FIG. 2. A positive acoustic coupling between the porous member 11 and the membrane 10 is ensured in this way. The porous member 11 is thus partially disposed in the inner passage opening 5.

The material of the porous member is an open porous material. It is ensured in this way that the porous member 11 has the noise permeability desired for the airborne noise that is to be directed to the outside, out of the housing interior 4. The porous member 11 can be particularly easily produced when the material of the latter is or comprises a sintered material. A sintered metal, a sintered glass, or a sintered plastics material, is to be considered in particular.

The membrane 10 comprises a textile material, or is composed of a textile material, which is configured so as to be fluid-tight and airborne noise-permeable. The mentioned materials have the desired fluid tightness, such that a contamination of the porous member 11 by dirt particles from the external environment 18 of the housing 1 is prevented. At the same time, the mentioned materials however also have a high noise permeability to the airborne noise that is to be directed out of the housing interior 4 to the outside, into the external environment 18 of the housing 1.

As can be furthermore seen in FIG. 1 the porous member 11 comprises a main portion 15 which is at least partially disposed in the inner passage opening 5. The main portion 15 transitions axially inwards, thus along an axial direction A, towards the housing interior 4, into a fastening portion 16 which protrudes the main portion 15 in a radially outwards manner, thus along a radial direction R. The porous member 11 by means of the fastening portion 16 is fastened to an internal side 17 of the inner housing part 3. The fastening is preferably performed by means of an adhesive connection 22. Such an adhesive connection 22 ensures that no passage gap can be configured between the porous member 11 and the inner housing part 3, through which passage gap a gas that has been ignited in the housing interior 4 can make its way as a leakage from the housing interior 4 to the outside, into the external environment 18 of the housing 1. The porous member 11 in a longitudinal section along the axial direction A thus has a T-type geometry.

The inner housing part 3 can be composed of a transparent glass. Such a transparent glass is to be considered as the material for the inner housing part 3 in particular when the electrically operated apparatus 2 is a tablet computer, the display (not shown) of the latter intended to be visible from the outside to the user. In this case, a respective passage opening in the outer housing part 6, which can be composed, for example, of a metal or of a plastics material, can be provided in such a manner that an undesirable masking of the display by the outer housing part 6 is avoided. Other suitable materials can be used for both the inner housing part 3 as well as for the outer housing part Q in variants of the example.

The invention claimed is:

1. A housing for receiving an electrically operated apparatus, comprising:
- an inner housing part at least partially defining a housing interior, the inner housing part including an inner passage opening;
- an outer housing part disposed on a side of the inner housing part facing away from the housing interior, the outer housing part including an outer passage opening;
- the outer passage opening and the inner passage opening at least partially define an acoustic duct for discharging airborne noise from the housing interior;
- the acoustic duct closed by a fluid-tight and airborne noise-permeable membrane; and
- a porous material disposed within the acoustic duct configured to prevent an ignition breakthrough from the housing interior into an external environment outside of the outer housing part.

2. The housing according to claim 1, wherein the porous material is permeable to airborne noise.

3. The housing according to claim 1, further comprising:
- an opening collar projecting outwardly, away from the inner housing part and surrounding the outer passage opening;
- at least one cut-out configured to pass airborne noise disposed on the opening collar; and
- a cover disposed on the opening collar and axially covering the outer passage opening.

4. The housing according to claim 3, wherein the membrane is disposed spaced apart from the cover.

5. The housing according to claim 1, wherein the membrane is disposed spaced apart from the porous material.

6. The housing according to claim 1, wherein a distance from the membrane to the porous material is 1 mm or less.

7. The housing according to claim 1, wherein the membrane is coupled to the outer housing part via an outer periphery.

8. The housing according to claim 1, wherein the porous material is at least partially disposed in the inner passage opening.

9. The housing according to claim 1, wherein a portion of the acoustic duct is disposed in the housing interior and acoustically connected to the external environment via the inner passage opening and the outer passage opening.

10. The housing according to claim 1, further comprising a separation element disposed within the housing interior acoustically separating a portion of the housing interior defining a portion of the acoustic duct from a complementary portion of the housing interior.

11. The housing according to claim 1, wherein the porous material extends across an entire duct cross-sectional area of the inner passage opening.

12. The housing according to claim 1, wherein the porous material is disposed within and engages entirely through the inner passage opening.

13. The housing according to claim 1, wherein the porous material includes a main portion disposed in the inner passage opening and extending inward towards the housing interior into a fastening portion, the fastening portion protruding radially outward from the main portion, and wherein the porous material is coupled to an internal side of the inner housing part via the fastening portion.

14. The housing according to claim 13, wherein the fastening portion is coupled to the inner housing part via an adhesive connection.

15. The housing according to claim 1, wherein the porous material has a T-type geometry in an axial longitudinal section.

16. The housing according to claim 1, wherein the inner housing part is composed of glass and the outer housing part is composed of at least one of a metal material and a plastic material.

17. The housing according to claim 1, wherein the porous material is an open porous material.

18. The housing according to claim 1, wherein the porous material includes a sintered material.

19. The housing according to claim 18, wherein the sintered material comprises a sintered metal, a sintered glass, or a sintered plastics material.

20. The housing according to claim 1, wherein the membrane includes a flexible material.

21. The housing according to claim 1, wherein the inner housing part and the outer housing part are at least one of separate components and composed of different materials.

22. The housing according to claim 1, wherein the porous material is at least partially disposed within the inner passage opening and protrudes axially out of the inner passage opening in each axial direction.

23. An assembly, comprising:
- a housing defining a housing interior, the housing including an inner housing part and an outer housing part disposed on a side of the inner housing part facing away from the housing interior, the inner housing part including an inner passage opening, and the outer housing part including an outer passage opening;
- an acoustic duct for discharging airborne noise from the housing interior, the acoustic duct at least partially defined by the inner passage opening and the outer passage opening and closed by a fluid-tight and airborne noise-permeable membrane;

a porous material disposed within the acoustic duct configured to prevent an ignition breakthrough from the housing interior into an external environment outside of the housing; and an electrical apparatus disposed in the housing interior.

* * * * *